(12) United States Patent
Bloomfield et al.

(10) Patent No.: US 9,791,568 B2
(45) Date of Patent: Oct. 17, 2017

(54) DEVICE FOR DETERMINING THE DISTANCE TO AN OUTER SURFACE OF A ROLL OF MATERIAL AND RELATED METHOD

(71) Applicant: STMICROELECTRONICS, INC., Coppell, TX (US)

(72) Inventors: John Bloomfield, North Richland Hills, TX (US); Kenneth Weiner, Denton, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/587,130

(22) Filed: Dec. 31, 2014

(65) Prior Publication Data

US 2016/0187484 A1 Jun. 30, 2016

(51) Int. Cl.
*G01S 17/32* (2006.01)
*G01S 17/88* (2006.01)
(Continued)

(52) U.S. Cl.
CPC .......... *G01S 17/32* (2013.01); *B65H 23/1825* (2013.01); *B65H 23/1955* (2013.01); *B65H 26/08* (2013.01); *G01S 17/08* (2013.01); *G01S 17/88* (2013.01); *H01L 31/107* (2013.01); *H01S 5/183* (2013.01); *H01S 5/3013* (2013.01); *B65H 2403/942* (2013.01); *B65H 2511/142* (2013.01); *B65H 2553/412* (2013.01); *B65H 2557/512* (2013.01)

(58) Field of Classification Search
CPC ...................................................... G01S 17/32

USPC ......................................................... 356/5.01
See application file for complete search history.

(56) References Cited

U.S. PATENT DOCUMENTS 8,610,043 B2   12/2013   Baxter
2007/0131817 A1*  6/2007  Fromm et al. ............. 242/563.2
(Continued)

FOREIGN PATENT DOCUMENTS

CN    203054618 U    7/2013
CN    103398661 A    11/2013
(Continued)

OTHER PUBLICATIONS

Gilbert, "Methods of Diameter Determination for Center Driven Unwinds & Rewinds," Siemens Energy & Automation, Downloaded from the Internet on Nov. 21, 2014; https://www.industry.usa.siemens.com/drives/us/en/motion-control-systems-and-solutions/motion-control-industry-solutions/converting/converting-tab/Documents/IND-converting-methods-of-diameter-determination.pdf, Aug. 23, 2006; pp. 1-11.
(Continued)

*Primary Examiner* — David Porta
*Assistant Examiner* — Hugh H Maupin
(74) *Attorney, Agent, or Firm* — Slater Matsil, LLP

(57) ABSTRACT

A sensing device is for sensing an outer surface of a roll of material. An infrared (IR) laser source is configured to direct IR laser radiation to the outer surface of the roll of material. A single photon avalanche diode (SPAD) detector is configured to receive reflected IR laser radiation from the outer surface of the roll of material. A controller is coupled to the IR laser source and the SPAD detector to determine a distance to the outer surface of the roll of material based upon a time-of-flight of the IR laser radiation.

21 Claims, 3 Drawing Sheets

(51) Int. Cl.
    *H01L 31/107*     (2006.01)
    *H01S 5/183*     (2006.01)
    *H01S 5/30*     (2006.01)
    *B65H 26/08*     (2006.01)
    *G01S 17/08*     (2006.01)
    *B65H 23/182*     (2006.01)
    *B65H 23/195*     (2006.01)

(56) References Cited

U.S. PATENT DOCUMENTS

| | | | |
|---|---|---|---|
| 2007/0278341 A1 | 12/2007 | Tsurunaga et al. | |
| 2012/0051383 A1* | 3/2012 | Stern | 372/50.21 |
| 2013/0099101 A1 | 4/2013 | Campbell | |
| 2014/0027606 A1 | 1/2014 | Raynor et al. | |
| 2014/0124652 A1 | 5/2014 | Dutton et al. | |
| 2014/0168632 A1* | 6/2014 | Eisele et al. | 356/5.01 |
| 2015/0083900 A1* | 3/2015 | Caley et al. | 250/221 |
| 2015/0285625 A1* | 10/2015 | Deane | 348/140 |

FOREIGN PATENT DOCUMENTS

| | | |
|---|---|---|
| CN | 103885064 A | 6/2014 |
| CN | 205748293 U | 11/2016 |
| EP | 2728373 | 5/2014 |

OTHER PUBLICATIONS

Banner Engineering Corporation, Minneapolis, MN; Marketing Brochure; "L-GAGE LT3 Long-Range Time-of-Flight Laser Sensor," Downloaded from the Internet on Nov. 21, 2014; P/N 65742, Rev. D, Feb. 2005; www.bannerengineering.com; pp. 1-12.

* cited by examiner

DEVICE FOR DETERMINING THE DISTANCE TO AN OUTER SURFACE OF A ROLL OF MATERIAL AND RELATED METHOD

FIELD OF THE INVENTION

The present invention relates to determining the distance to the outer surface of a roll of material, and more particularly, for determining the quantity of material remaining on a dispensing or take-up roll.

BACKGROUND

Industrial paper mills, carpet warehouses, newspaper print shops, textile mills, and other industrial environments use rolls or spools that dispense or take-up a sheet of material (or web) during processing. There are numerous techniques to track the material remaining on the roll and replace the rolls when necessary. Different mechanical or electronic sensor devices may track how much material is either wound onto or unwound from the roll, indicating the rate of change and determining the time before the roll is empty or full and must be replaced.

For example, some devices sense a reduced roll diameter as it dispenses the sheet material and cooperate with a web splicing apparatus in which a new roll is inserted onto the mandrel and spliced into the old sheet once the sensing mechanism determines that a new roll is required. Roll diameter sensing mechanisms are also used in torque regulated tension control systems where the measured diameter of the roll provides an inertia compensation for acceleration and deceleration and a torque or tension set point. For example, in a speed regulated tension control system, the measured diameter is used for inertia calculations that adjust a speed loop gain and velocity set point for a drive motor.

A mechanical lay-on roller is a more simple tension control system where a lay-on roller on a pivoting follower arm contacts the outside diameter of the roll. A sensor is mounted to a pivot point on the follower arm. The measured angle of the follower arm from the sensor is converted into the roll diameter. The sensor tracks how much material is on the roll and indicates the rate of change and determines the time before the roll is empty. Although these lay-on roller systems are simple, the roller must contact the surface of the material on the roll, which can be an issue in industrial environments because of slippage and inaccurate diameter readings. Also, mechanical systems require extensive maintenance almost every day in harsh industrial environments.

Ultrasonic sensors have been used to measure the roll diameter. The system determines the rate of change of material on the roll and the time before the roll becomes full or empty or full and must be replaced. Ultrasonic sensors are not advantageous in some industrial environments, however, because the sheet of material on the roll may absorb the sound waves and give inaccurate measurements.

Other systems use a laser to emit a 6 millimeter (mm) wide beam, visible red light that bounces off the roll and scatters some of its light through a sensor's receiving lens into a photodiode. The time interval between the transmitted and received electrical pulses is used to calculate the distance to the roll using the speed of light and time-of-flight calculations. These visible red light laser systems use special diffused mode sensors because the laser is a visible red light having a wide beam of about 6 millimeters to ensure that a wide surface on the roll is illuminated. Although these systems may operate well in a clean industrial environment using the time-of-flight calculations, the wide diameter beam with the red visible light may need special diffuse mode sensors that may not be adequate in harsh industrial environments.

SUMMARY

A sensing device is for sensing an outer surface of a roll of material and comprises an infrared (IR) laser source configured to direct IR laser radiation to the outer surface of the roll of material. A single photon avalanche diode (SPAD) detector is configured to receive reflected IR laser radiation from the outer surface of the roll of material. A controller is coupled to the IR laser source and the SPAD detector to determine a distance to the outer surface of the roll of material based upon a time-of-flight of the IR laser radiation.

The SPAD detector may comprise an array of single photon avalanche diodes. The IR laser source, SPAD detector and controller may be formed as a single integrated circuit (IC). In an embodiment, the IR laser source may have an operating wavelength in a range of 800-900 nanometers. The IR laser source may comprise a vertical-cavity surface-emitting laser (VCSEL).

The controller is configured to determine a quantity of material on the roll. The sensing device may comprise at least one indicator and the controller is configured to activate an indicator based upon the determined quantity of material on the roll. The roll may be a dispensing roll and the controller is configured to determine a feed rate of material from the dispensing material. The sensing device may also activate the indicator based upon the determined feed rate of material from the dispensing roll.

In another embodiment, the roll is a take-up roll and the controller is configured to determine a take-up rate of material onto the take-up roll. The sensing device may comprise at least one indicator and the controller is configured to operate the at least one indicator based upon the determined take-up rate of material onto the take-up roll.

A method of sensing an outer surface of a roll of material includes using an infrared (IR) laser source to direct IR laser radiation to the outer surface of the roll of material. The method includes using a single photon avalanche diode (SPAD) detector to receive reflected IR laser radiation from the outer surface of the roll material. The method includes using a controller coupled to the IR laser source and the SPAD detector to determine the distance to the outer surface of the roll of material based upon a time-of-flight of the IR laser radiation.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
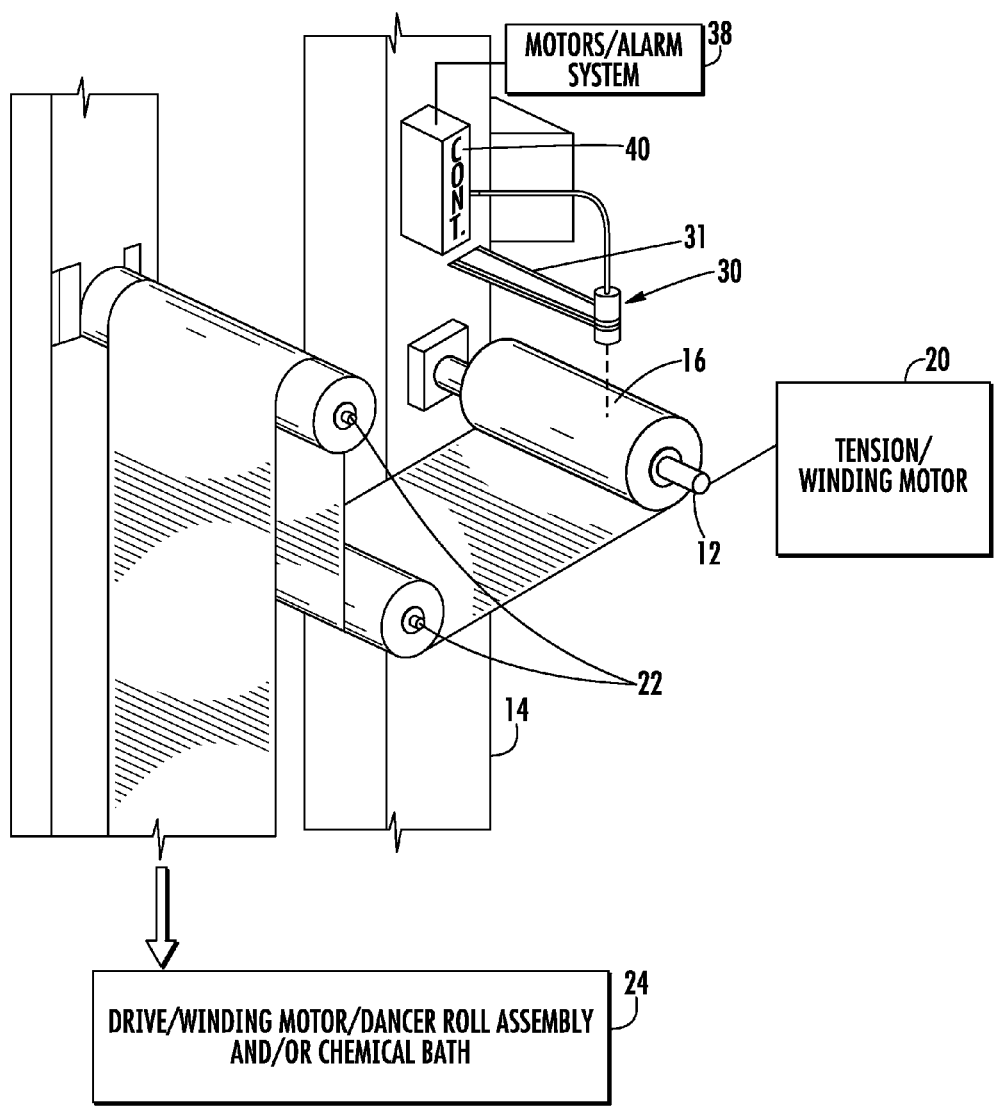
FIG. 1 is a perspective view of a sheet processing facility and showing the sensing device for sensing an outer surface of the roll of material to determine its diameter in accordance with a non-limiting example.

FIG. 1 is a perspective view of a sheet processing facility illustrated generally at 10 that includes a roll mandrel 12 rotatably mounted on a machine frame 14 that supports a roll of material 16 that is rotatably driven to take-up (wind) or dispense (unwind) the roll of material 16. Although FIG. 1 shows a general industrial environment, different materials could be used and processed, for example, in industrial paper mills, carpet warehouses, newspaper print shops, textile mills, or other applications where a sheet of material is taken-up or dispensed on rolls and spools. In this example, the mandrel holding the roll of material is connected to a tension or winding motor 20 that applies back tension if a sheet of material is being unwound (or dispensed) or applies a winding force for taking up a sheet of material positioned on a roll cylinder secured on the mandrel 12.

The sheet is fed onto idler rolls 22 and could have been previously processed or will be processed such as in a chemical bath 24 as an example. A dancer roll assembly can be used in the case of high speed web delivery systems that require extensive back tension control during sheet delivery.

FIG. 1 is a representative example of a general industrial environment and the sensing device illustrated generally at 30 may be used for sensing the outer surface of many different rolls of material. This description is an example for many different processes as suggested to those skilled in the art. As illustrated, the sensing device 30 is mounted on a support bracket 31 and senses an outer surface of the roll of material 16.

Figure 2:
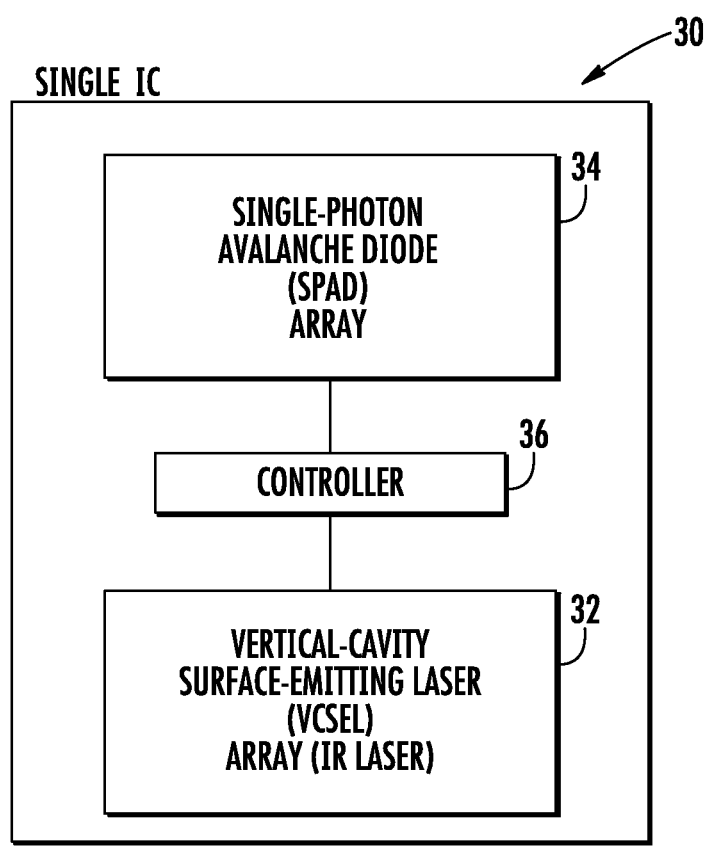
FIG. 2 is a block diagram of basic components of the sensing device in accordance with a non-limiting example.

As shown in the high level block diagram of FIG. 2, the sensing device 30 includes an infrared (IR) laser source 32 configured to direct IR laser radiation to the outer surface of the roll of material 16. A single photon avalanche diode (SPAD) detector 34 is configured to receive the IR laser radiation from the outer surface of the roll of material. A controller 36 is coupled to the IR laser source 32 and the SPAD detector 34 and determines a distance to the outer surface of the roll of material based upon time-of-flight calculations of the IR laser radiation. The laser source 32, SPAD detector 34 and controller 36, in an example, are formed as a single integrated circuit (IC). An example circuit is the VL6180X module manufactured by STMicroelectronics.

The controller 36 may determine a quantity of material remaining on the roll. For example, based upon measuring the distance from the roll of material 16 using the time-of-flight calculations, the amount of material taken-up or dispensed from the roll is determined and the quantity of material remaining on the roll established. From that information, the controller 36 may operate an indicator 38 (FIG. 1) such as an alarm or display based upon the determined quantity of material remaining on the roll to indicate to the machine operator that the roll must be changed. The controller 36 in the sensing device 30 is operable with a main machine controller 40 to control the different winding and tension motors, an alarm system and display 38, and any system (not shown) that splices material onto an existing web of material or provides a new cylinder that is received over the mandrel 12 onto which material is dispensed or taken-up.

For example, when the roll is a dispensing roll, controller 36 is configured to determine a feed rate of material and the controller operates at least one indicator 38 such as an alarm bell based upon a predetermined feed rate of material from the dispensing roll. When the roll of material has been completely dispensed, a new roll can be inserted. When the roll is a take-up roll, the controller 36 is configured to determine a take-up rate of material onto the take-up roll and the controller is configured to operate the at least one indicator, such as the alarm 38, based upon the determined take-up rate of material on the take-up roll. When the roll is full, a new take-up roll can be inserted.

Figure 3:
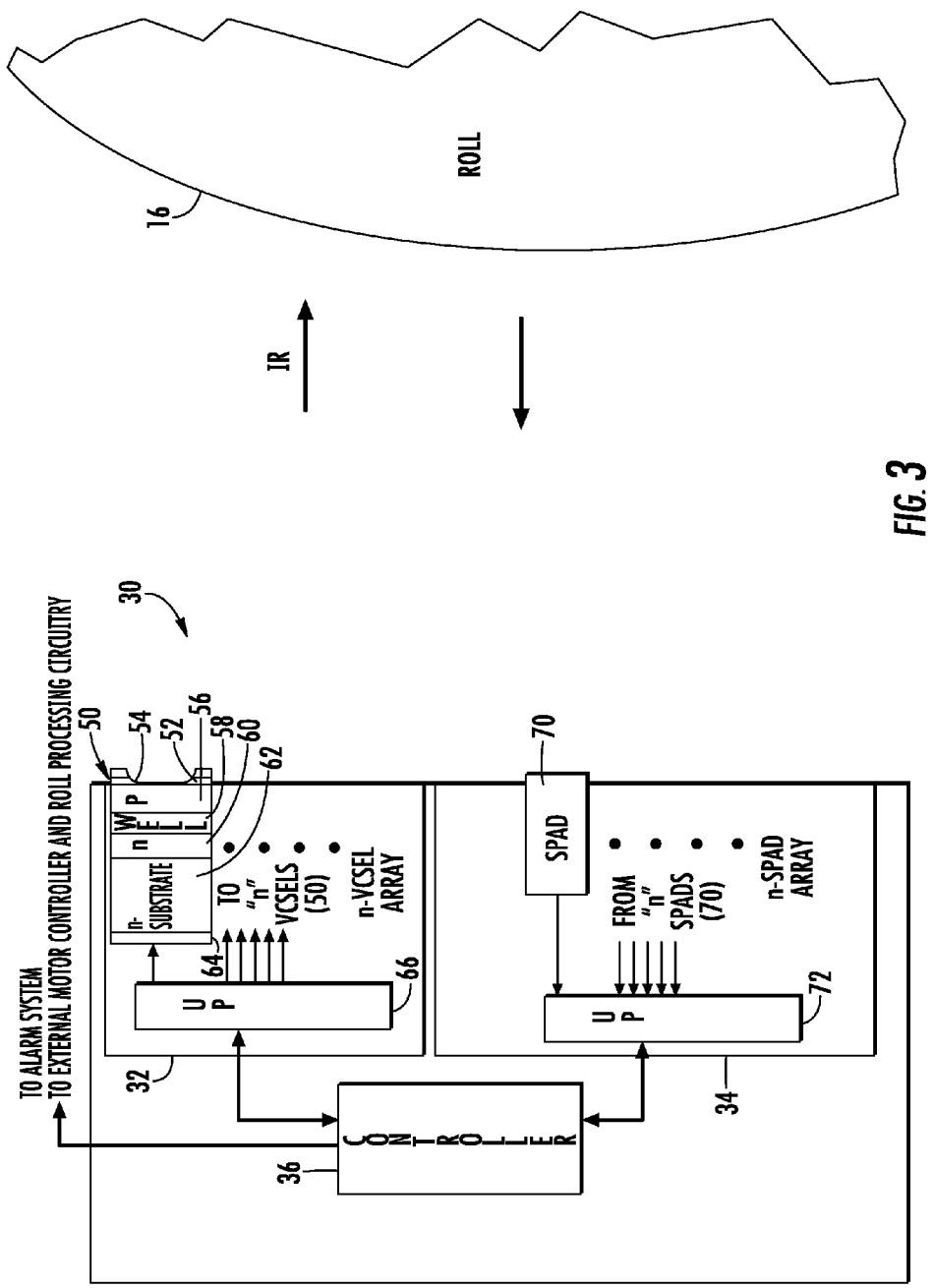
FIG. 3 is a more detailed block diagram of the sensing device as shown in FIG. 2 in accordance with a non-limiting example.

FIG. 3 is a more detailed block diagram of the sensing device 30 and showing details of the IR laser source 32 formed as an array of vertical-cavity surface-emitting laser (VCSEL) elements 50. Each VCSEL element 50 is formed as a semiconductor laser diode that emits light perpendicular to the surface and includes active layers with the thickness of a few nanometers (nm). The VCSEL elements 50 can be formed from different semiconductor processing techniques and include different active layers.

Most VCSEL elements share a general configuration. Electrical carriers are converted into light above and below an active layer. There may be multiple layers of alternating refractive index resonant mirrors having high reflectivity to achieve gain. The resonant mirrors are formed in one example as doped semiconductor mirrors that provide electrical contacts to active layers that may be defined by the width of an oxidized layer near an active layer. They may be formed in a single epitaxial growth process where semiconductor wafer processing steps define the emission area and provide electrical terminals to individual laser-diodes forming the VCSEL element 50. Each VCSEL element 50 is a vertical structure and a large number of VCSEL elements as laser diodes may be placed next to each other as a two-dimensional array and connected individually or in parallel.

The VCSEL array may be formed from thousands of the smaller VCSEL elements 50 and manufactured on GaAs wafers where the pitch between individual elements is about 40 um. In the example used with reference to the system of FIG. 1, the laser source 32 has an operating wavelength in the range of 800-900 nanometers, and in a specific example, 850 nm, but can extend up to 1,300 nm or higher depending on the industrial application, how the infrared beam is used, and with what roll material.

A single and simplified example of a VCSEL element 50 is illustrated and includes a metal contact 52 with an opening 54 through which the infrared beam is emitted. The VCSEL element 50 includes an upper Bragg reflector 56 formed of P-type material, a quantum well 58 and a lower Bragg reflector 60 formed of an N-type material. An N-substrate 62 and metal contact 64 are included. The upper and lower Bragg reflectors (DBR) 56, 60 form mirrors and are parallel to a wafer surface and have one or more quantum wells for laser light generation. Usually the Bragg reflector mirrors include alternating high and low refractive indices and a thickness of about a quarter of the laser wavelength in a non-limiting example to yield a high reflectivity. These mirrors balance the short axial length of the gain region. The upper and lower Bragg reflector mirrors may be formed of P-type and N-type material to form a diode junction, but other N-type and P-type regions may be embedded between mirrors in non-limiting examples. The GaAs substrate allows multiple epitaxial layers to be grown. A microprocessor 66 is connected to each VCSEL element 50 to provide current control and any type of laser aiming and coordination among the VSCEL elements 50.

FIG. 3 illustrates an array of single photon avalanche diodes (SPAD's) that form an "N" SPAD array with each diode forming a detector element 70 connected to a microprocessor 72. Each SPAD detector element 70 is a solid-state photo detector in which a photo-generated carrier can trigger an avalanche current to detect low intensity signals such as a single photon. The microprocessor 72 processes the signal arrival times of photons with a jitter of a few tens of picoseconds. Usually a SPAD detector element 70 includes a reverse bias P-N junction to detect the infrared radiation and operates with reverse-bias voltage above the breakdown voltages in a "Geiger mode" similar to a conventional Geiger counter. Different SPAD detection elements 70 may be used as known to those skilled in the art depending on the industrial application to which the sensing device is employed and the type of material that is wound on the roll. Various quenching circuits may be used, including passive and active quenching. Examples are disclosed in U.S. Pat. No. 8,610,043 to Baxter and U.S. Patent Publication No. 2014/0124652, the disclosures which are hereby incorporated by reference in their entirety The controller 36 operates with the microprocessors 66, 72 and various VCSEL elements 50 and SPAD detection elements 70 to determine a distance to the outer surface of the roll of material based upon a time-of-flight of the IR laser radiation. The controller 36 determines the amount of material remaining on the roll and determines when a roll must be replaced. The different distance measurements are collected and time stamped as the machine is running and the value increases or decreases in distance over time and the rate of use of the material is the gradient of time versus the distance. This rate of time allows the user of the machine to predict the time left before the roll is to be replaced. The data can be further processed to collect run rate statistics and validate material that is not removed when the factory is not running. Over a period of many hours or days, end points can be set and rates monitored to allow a more efficient production process. When multiple roll winding and dispensing units such as shown in FIG. 1 are used in tandem, factory automation can be achieved and more efficient operation established. The machine controller 40 will interoperate with any LED indicators, sounds or alarms to set local alerts and allow centralized monitoring in a control center.

A method of sensing an outer surface of a roll of material includes using an infrared (IR) laser source to direct IR laser radiation to the outer surface of the roll of material. The method also includes using a single photon avalanche diode (SPAD) detector to receive reflected IR laser radiation from the outer surface of the roll of material and using a controller coupled to the IR laser source and the SPAD detector to determine a distance to the outer surface of the roll of material based upon a time-of-flight of the IR laser radiation.

The method includes using the controller to determine a quantity of material on the roll. In an embodiment, the roll is a dispensing roll and the method includes using the controller to determine a feed rate of material from the dispensing roll. In another embodiment, the roll is a take-up roll and the method includes using the controller to determine a take-up rate of material onto the take-up roll. The method also includes operating at least one indicator based on the controller.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A sensing device for sensing an outer surface of a roll of material comprising:
   a plurality of infrared (IR) laser sources, each laser source comprising a vertical-cavity surface-emitting laser (VCSEL) configured to direct an IR laser radiation beam to the outer surface of the roll of material, wherein the outer surface of the roll of material extends in a direction orthogonal to a direction of the IR laser radiation and orthogonal to a direction of a first diameter of the roll of material;
   a single photon avalanche diode (SPAD) detector comprising an array of single photon avalanche diodes configured to detect reflected IR laser radiation beams from the outer surface of the roll of material; and
   a controller coupled to said plurality of IR laser sources and said SPAD detector to determine a distance to the outer surface of the roll of material based upon a calculated time-of-flight of the IR laser radiation beams reflected from the outer surface of the roll of material and detected by the SPAD detector, wherein
      said IR laser sources, SPAD detector, and controller are formed as a single integrated circuit (IC) and
      said controller is configured to determine a quantity of material on the roll of material based on a distance measured between the outer surface of the roll of material and the IC.

2. The sensing device of claim 1 wherein said IR laser sources have an operating wavelength in a range of 800 to 900 nanometers.

3. The sensing device of claim 1 further comprising at least one indicator; and wherein said controller is configured to operate said at least one indicator based upon the determined quantity of material on the roll.

4. The sensing device of claim 1 wherein the roll is a dispensing roll; and wherein said controller is configured to determine a feed rate of material from the dispensing roll.

5. The sensing device of claim 4 further comprising at least one indicator; and
   wherein said controller is configured to operate said at least one indicator based upon the determined feed rate of material from the dispensing roll.

6. The sensing device of claim 1 wherein the roll is a take-up roll; and wherein said controller is configured to determine a take-up rate of material onto the take- up roll.

7. The sensing device of claim 6 further comprising at least one indicator; and
   wherein said controller is configured to operate said at least one indicator based upon the determined take-up rate of material onto the take-up roll.

8. The sensing device of claim 1 wherein the IR laser sources are implemented with GaAs technology.

9. A sensing device for sensing an outer surface of a roll of material comprising:
   a plurality of infrared (IR) laser sources configured to direct IR laser radiation beams to the outer surface of the roll of material, each of said IR laser sources comprising a vertical-cavity surface-emitting laser (VCSEL);
   a single photon avalanche diode (SPAD) detector configured to detect reflected IR laser radiation beams from the outer surface of the roll of material, said SPAD detector comprising an array of single photon avalanche diodes; and a controller coupled to said plurality of IR laser sources and said SPAD detector to determine a distance to the outer surface of the roll of material based upon a calculated time-of-flight of the IR laser radiation beams reflected from the outer surface of the roll of material and detected by the SPAD detector, wherein the IR laser sources and the SPAD are integrated into a single integrated circuit (IC), the IR laser sources being implemented with GaAs technology.

10. The sensing device of claim 9 wherein said IR laser sources have an operating wavelength in a range of 800 to 900 nanometers.

11. The sensing device of claim 9 wherein said controller is configured to determine a quantity of material on the roll.

12. The sensing device of claim 9 wherein the roll is a dispensing roll; and
wherein said controller is configured to determine a feed rate of material from the dispensing roll.

13. The sensing device of claim 9 wherein the roll is a take-up roll; and wherein said controller is configured to determine a take-up rate of material onto the take-up roll.

14. The sensing device of claim 9 further comprising at least one indicator coupled to said controller.

15. A method of sensing an outer surface of a roll of material comprising:
using a plurality of infrared (IR) laser sources, each comprising a vertical-cavity surface-emitting laser (VCSEL) to direct an IR laser radiation beam to the outer surface of the roll of material wherein the outer surface of the roll of material extends in a direction orthogonal to a direction of the IR laser radiation and orthogonal to a direction of a first diameter of the roll of material;
using a single photon avalanche diode (SPAD) detector comprising an array of single photon avalanche diodes to detect reflected IR laser radiation beams from the outer surface of the roll of material; and
determining a distance to the outer surface of the roll of material based upon a calculated time-of-flight of the IR laser radiation beams reflected from the outer surface of the roll of material and detected by the SPAD detector, wherein the IR laser sources, SPAD detector, and controller are formed as a single integrated circuit (IC).

16. The method of claim 15 wherein the IR laser sources have an operating wavelength in a range of 800 to 900 nanometers.

17. The method of claim 15 further comprising using the controller to determine a quantity of material on the roll.

18. The method of claim 15 wherein the roll is a dispensing roll; and further comprising using the controller to determine a feed rate of material from the dispensing roll.

19. The method of claim 15 wherein the roll is a take-up roll; and further comprising using the controller to determine a take-up rate of material onto the take-up roll.

20. The method of claim 15 further operating at least one indicator based on the controller.

21. The method of claim 15, further comprising:
collecting distance measurements between the IC and the outer surface of the roll of material;
time stamping the distance measurements;
determining a rate of use based on the time stamping of the distance measurements; and
predict a time left before the roll of material is to be replaced based on the determining the rate of use.

* * * * *